(12) United States Patent  (10) Patent No.: US 9,082,642 B2
Kim et al.  (45) Date of Patent: Jul. 14, 2015

(54) SEMICONDUCTOR DEVICE

(71) Applicant: SK hynix Inc., Icheon-si Gyeonggi-do (KR)

(72) Inventors: Hyun Sub Kim, Gyeonggi-do (KR); Jung Won Park, Incheon (KR)

(73) Assignee: SK Hynix Inc., Gyeonggi-do (KR)

( * ) Notice: Subject to any disclaimer, the term of this patent is extended or adjusted under 35 U.S.C. 154(b) by 64 days.

(21) Appl. No.: 14/043,908

(22) Filed: Oct. 2, 2013

(65) Prior Publication Data
US 2014/0369121 A1 Dec. 18, 2014

(30) Foreign Application Priority Data

Jun. 12, 2013 (KR) .................. 10-2013-0067297

(51) Int. Cl.
G11C 16/04 (2006.01)
G11C 16/12 (2006.01)
H01L 27/105 (2006.01)
H01L 27/088 (2006.01)
G11C 8/08 (2006.01)
H01L 27/02 (2006.01)
H01L 27/115 (2006.01)

(52) U.S. Cl.
CPC ............ *H01L 27/088* (2013.01); *G11C 8/08* (2013.01); *G11C 16/04* (2013.01); *G11C 16/12* (2013.01); *H01L 27/0207* (2013.01); *H01L 27/11526* (2013.01)

(58) Field of Classification Search
CPC .. H01L 27/1052; H01L 27/088; G11C 16/04; G11C 16/12
USPC ...................... 365/185.11; 257/390
See application file for complete search history.

(56) References Cited

U.S. PATENT DOCUMENTS 7,239,556 B2 * 7/2007 Abe et al. ................. 365/185.33
2012/0236619 A1 * 9/2012 Kutsukake et al. ............. 365/72

FOREIGN PATENT DOCUMENTS

KR 1020060005710 A 1/2006
KR 100658288 B1 12/2006
KR 1020120062506 A 6/2012

* cited by examiner

Primary Examiner — Hoai V Ho
Assistant Examiner — Tri Hoang
(74) Attorney, Agent, or Firm — William Park & Associates Ltd.

(57) ABSTRACT

Disclosed is a semiconductor device, including: an active region defined in a shape extended in at least four different directions in a semiconductor substrate; and gates of first to fourth transistors formed on extended portions of the active region, respectively, in which the first to fourth transistors share one junction area.

18 Claims, 5 Drawing Sheets

SEMICONDUCTOR DEVICE

CROSS-REFERENCE TO RELATED APPLICATION

The present application claims priority to Korean patent application number 10-2013-0067297 filed on Jun. 12, 2013, in the Korean Intellectual Property Office, the entire disclosure of which is incorporated by reference herein.

BACKGROUND

1. Technical Field

The present invention relates to a semiconductor device.

2. Related Art

A memory device capable of storing data among the semiconductor devices is divided into a volatile memory device and a non-volatile memory device according to maintenance of the data when a power supply is cut. The volatile memory device is a memory device in which data dissipates when the power supply is cut, and dynamic random-access memory (DRAM) and static random-access memory (SRAM) belong to thereto. The non-volatile memory device is a memory device in which stored data is maintained as it is even though the power supply is cut, and a flash memory device belongs thereto.

For example, in a case of a floating gate-type non-volatile memory device storing data by injecting charges to a floating gate electrode, a program/erase operation is performed by a Fowler-Nordheim tunneling (F-N tunneling), and in this case, a program operation is performed by using a high voltage, such as a program voltage Vpgm and a pass voltage Vpass.

Accordingly, the non-volatile memory device includes a high voltage transistor for transmitting a high program voltage Vpgm or pass voltage Vpass supplied to a global word line.

A semiconductor memory device has the increased number of memory cells disposed within one memory block in order to implement high capacity, and thus the number of word lines connected with the memory cells is gradually increased. Accordingly, the number of high voltage transistors for transmitting an operation voltage to the word lines by connecting the word lines with the global word lines is also increased, thereby causing a problem of an increase in an area.

SUMMARY

The present invention has been made in an effort to decrease an area consumed of a semiconductor device.

The present invention has been made in an effort to provide a semiconductor device capable of decreasing an area of a switch unit.

An embodiment of the present invention provides a semiconductor device including: an active region defined in a shape extended in at least four different directions in a semiconductor substrate; and gates of first to fourth transistors formed on extended portions of the active region, respectively, in which the first to fourth transistors share one junction area.

An embodiment of the present invention provides a semiconductor device including: a plurality of memory blocks; and a plurality of switch units for connecting word lines of the plurality of memory blocks and a global word line, in which each of the plurality of switch units includes four or more pass transistors, and the four pass transistors share one junction area.

An embodiment of the present invention provides a semiconductor device including: a memory unit including a plurality of memory blocks; a voltage providing unit configured to generate operation voltages; a block selection signal generation unit configured to generate control signals for selecting the plurality of memory blocks; a switch unit configured to transmit the operation voltage to the plurality of memory block in response to the control signals, in which each of the plurality of switch units includes first to fourth pass transistors formed in a cross (+) shaped active region and disposed to share one junction area.

According to an embodiment of the present invention, the plurality of pass transistors for transmitting the operation voltages to the word lines of the plurality of memory blocks is configured to share the same junction, so that it is possible to decrease an area of the switch unit including the plurality of pass transistors, thereby improving a degree of integration of the semiconductor device.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, an embodiment is provided to more sincerely and fully disclose the present invention and to completely transfer the spirit of the present invention to those skilled in the art to which the present invention pertains, and the scope of the present invention should be understood by the claims of the present invention.

Figure 1:
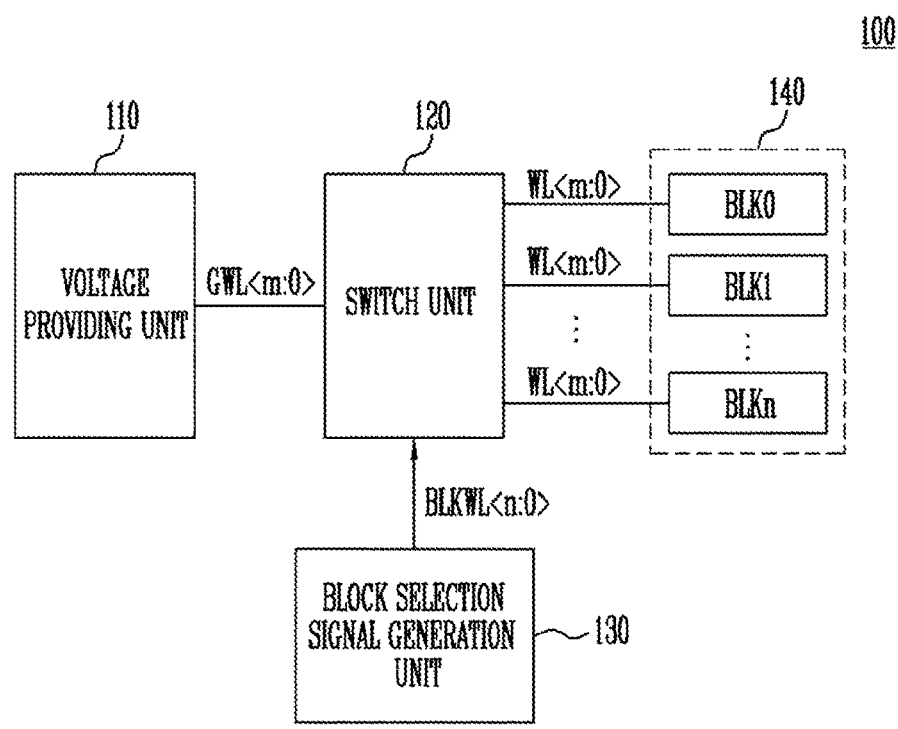
FIG. 1 is a diagram of a semiconductor device according to the present invention.

FIG. 1 is a diagram of a semiconductor device according to the present invention.

Referring to FIG. 1, a semiconductor device 100 may include a voltage providing unit 110, a switch unit 120, a block selection signal generation unit 130, and a memory unit 140.

The voltage providing unit 110 may generate operation voltages necessary for program, reading, and erasing operations, and output the generated operation voltages to the switch unit 120 through a plurality of global word lines GWL<m:0>.

The block selection signal generation unit 130 may output a plurality of block selection signals BLKWL<n:0> for controlling the switch unit 120. The plurality of block selection signals BLKWL<n:0> may be signals for controlling the switch unit 120 so as to selectively connect the plurality of global word lines GWL<m:0> and a word line group WL<m:0> corresponding to each memory block BLK0 to BLKn.

The switch unit 120 may selectively connect the plurality of global word lines GWL<m:0> and the word line group WL<m:0> corresponding to each memory block BLK0 to BLKn in response to the plurality of block selection signals BLKWL<n:0> output from the block selection signal generation unit 130. That is, the switch unit 120 may transmit the operation voltages generated by the voltage providing unit 110 and applied through the plurality of global word lines GWL<m:0> to the memory unit 140 through the word line group WL<m:0> corresponding to each memory block BLK0 to BLKn.

The memory unit 140 may include the plurality of memory blocks BLK0 to BLKn, and each memory block BLK0 to BLKn may be connected to the corresponding word line group WL<m:0>. Further, the plurality of memory blocks BLK0 to BLKn may include a plurality of memory cells connected to the word lines WL<m:0>.

Figure 2:
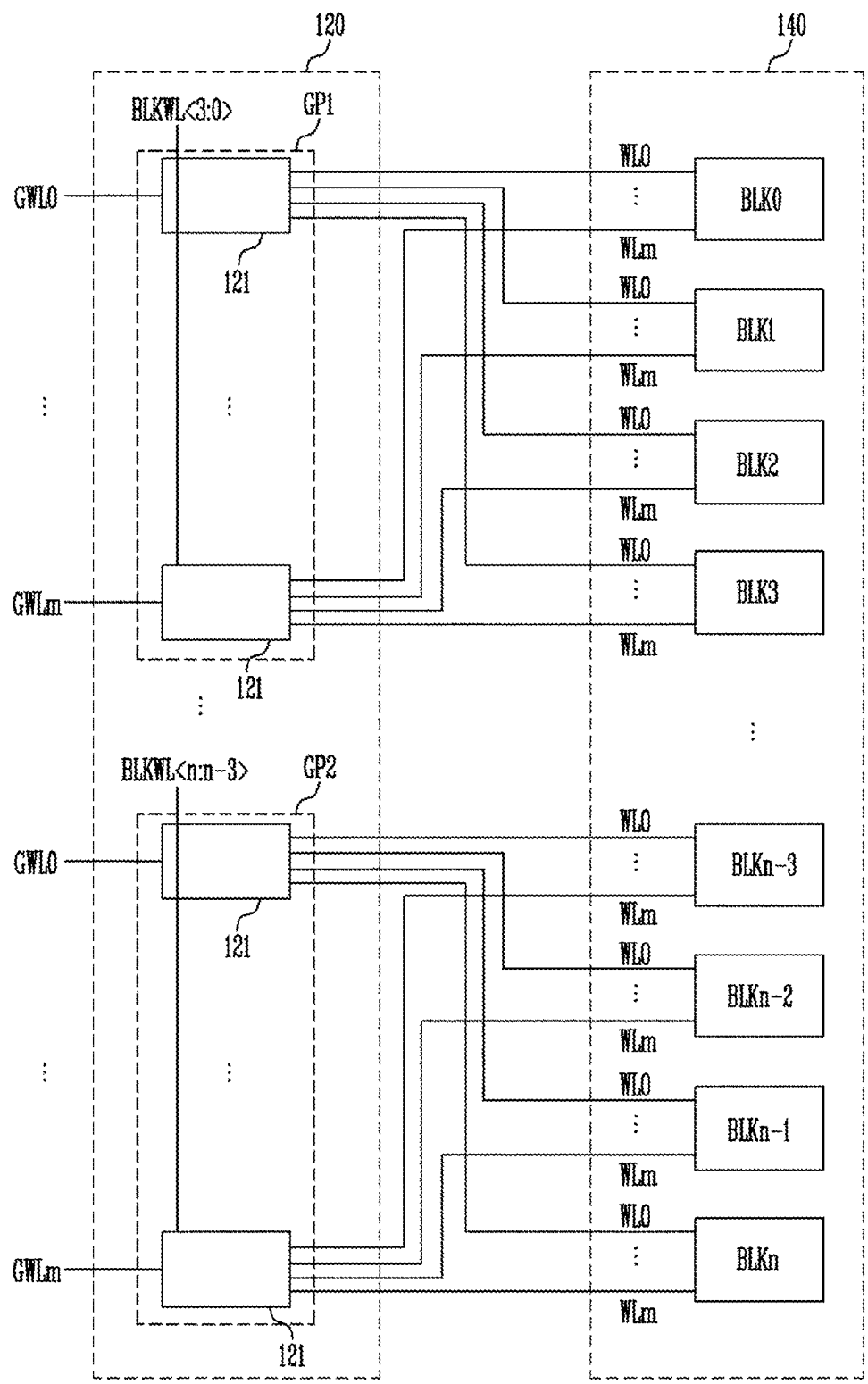
FIG. 2 is a diagram illustrating a connection relation between a switch unit 120 and a memory unit 140 illustrated in FIG. 1.

FIG. 2 is a diagram illustrating a connection relation between the switch unit 120 and the memory unit 140 illustrated in FIG. 1.

Referring to FIG. 2, the switch unit 120 may be configured to include a plurality of switch units 121. In an embodiment of the present invention, one switch unit 121 may be connected between one global word line (for example, GWL0) and a word line (for example, WL0) of each of four memory blocks (for example, BLK0 to BLK3), and selectively connect the one global word line GWL0 and the word line WL0 of each of the four memory blocks BLK0 to BLK3 in response to the block selection signals BLKWL<3:0>. Another switch unit 121 may be connected between one global word line GWLm and a word line WLm of each of the four memory blocks BLK0 to BLK3, and selectively connect the one global word line GWLm and the word line WLm of each of the four memory blocks BLK0 to BLK3 in response to the block selection signals BLKWL<3:0>. Further, another switch unit 121 may be connected between one global word line GWL0 and a word line WL0 of each of four memory blocks BLKn−3 to BLKn; and selectively connect the one global word line GWL0 and the word line WL0 of each of the four memory blocks BLKn−3 to BLKn in response to the block selection signals BLKWL<n:n−3>.

Further, a plurality of switch units 121 corresponding to the four memory blocks (for example, BLK0 to BLK3) may be defined as one switch group GP1. In addition, a plurality of switch units 121 corresponding to the memory blocks (for example, BLKn to BLKn−3) may be defined as one switch group GP2. The number of switch units 121 included in one switch group GP1 may preferably be the same as the number of global word lines GWL<m:0>. Further, the plurality of switch unit 121 of the one switch group GP1 may be controlled by the common block selection signals BLKWL<3:0>.

In an embodiment of the present invention, an embodiment in which one switch unit 121 corresponds to the four memory blocks has been described, but is not limited thereto, and may correspond to four or more memory blocks. This will be described with reference to FIG. 5 below.

Figure 3:
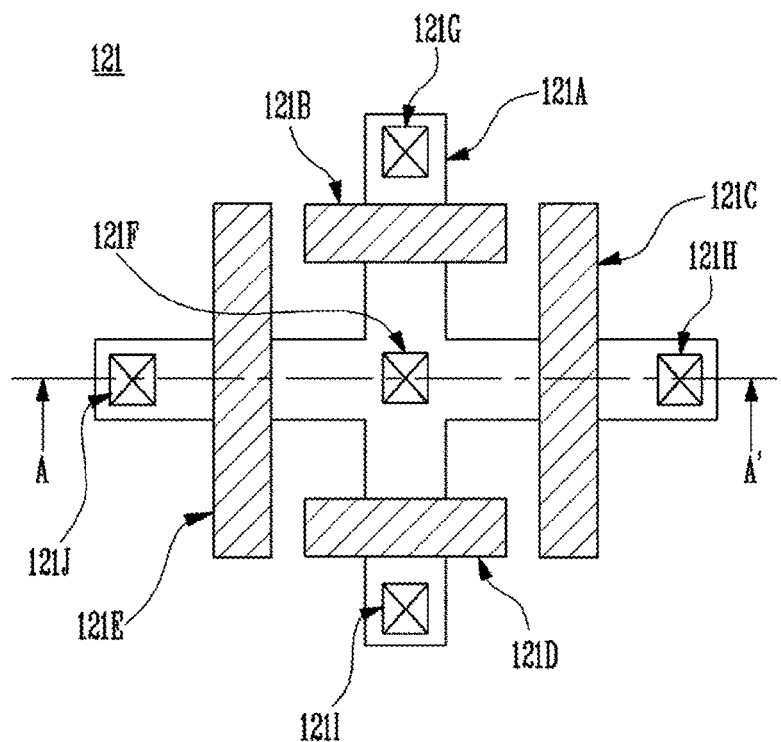
FIG. 3 is a top plan view of a switch unit illustrated in FIG. 2.

FIG. 3 is a top plan view of the switch unit illustrated in FIG. 2.

Referring to FIG. 3, one switch unit 121 may include first to fourth gate patterns 121B, 121C, 121D, and 121E on each extended portion of an active region 121A of a semiconductor substrate. Particularly, the first to fourth gate patterns 121B, 121C, 121D, and 121E crossing the active region may be formed up, down, left, and right four directional extended portions of the active region 121A defined in a cross (+) shape on the semiconductor substrate. Further, a first contact 121F connected with the global word line may be formed at a center portion of the cross (+)-shaped active region with lines A and A' on opposing sides, and second contacts 121G, 121H, 121I, and 121J connected with the word lines of the four memory blocks are formed at end portions of the up, down, left, and right four directional extended portions of the cross (+)-shaped active region. That is, four transistor gate patterns may be formed on the cross (+)-shaped active region 121A, and four pass transistors may share a junction of the active region 121A connected with the first contact 121F. Accordingly, it may be possible to decrease an area compared to a structure in which four pass transistors have the active regions, respectively.

Figure 4:
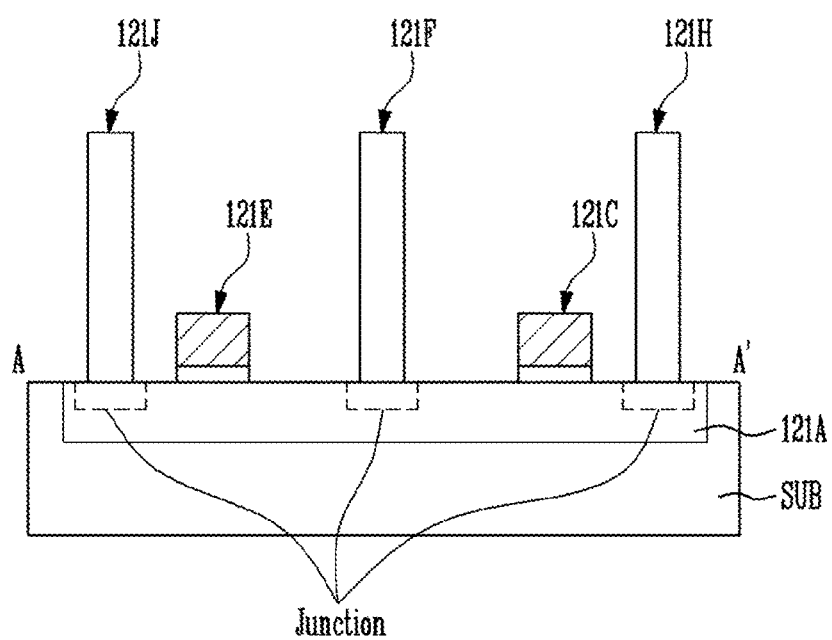
FIG. 4 is a cross-sectional view of the switch unit illustrated in FIG. 3.

FIG. 4 is a cross-sectional view of the switch unit illustrated in FIG. 3.

Referring to FIG. 4, the plurality of gate patterns 121E and 121C may be formed on the active region 121A of the semiconductor substrate SUB, and the second contacts 121J and 121H may be formed on both end portions of the active region 121A. Further, the first contact 121F may be formed on the active region 121A between the plurality of gate patterns 121E and 121C. A junction may be formed at the active region 121A with which the first contact 121F and the second contacts 121J and 121H are in contact through an ion injection process. Lines A and A' are on opposing sides as in FIG. 4.

Figure 5:
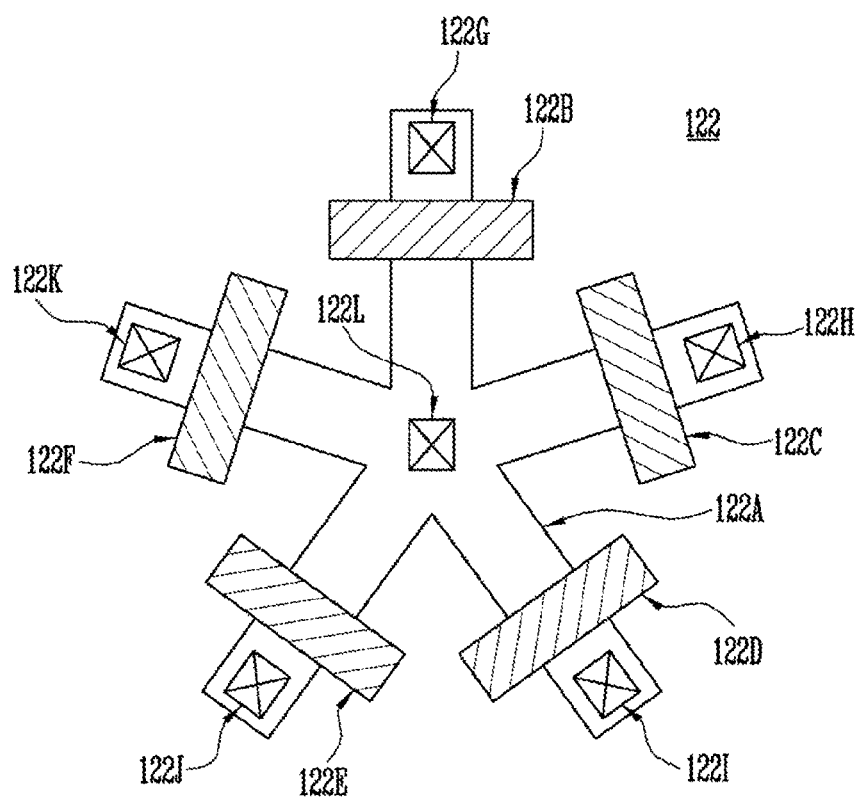
FIG. 5 is a top plan view illustrating an embodiment of the switch unit illustrated in FIG. 2.

FIG. 5 is a top plan view illustrating an embodiment of the switch unit illustrated in FIG. 2.

Referring to FIG. 5, a switch unit 122 may indicate the switch unit 121 of FIG. 2, but the switch unit of FIG. 5 may be denoted with the reference numeral 122 so as to be discriminated from the switch unit 121 illustrated in FIG. 3. In the switch unit 122 according to an embodiment of the present invention, five transistor gate patterns may share a junction of an active region to which the first contact 122L is connected. Second contacts may be 122G, 122H, 122I, 122J, and 122K. To this end, the active region 122A may be formed to have five extended portions as illustrated in FIG. 5, and first to fifth gate patterns 122B, 122C, 122D, 122E, and 122F crossing the active region may be formed on the extended portions, respectively.

Further, an embodiment of the present invention is not limited to the structures illustrated in FIGS. 3 and 5, but the active region may be configured to have six or more extended portions, and one switch unit may be configured to include six or more transistors by forming the gate patterns on the respective extended portions.

According to an embodiment of the present invention, the switch unit 121, in which the plurality of pass transistors may share the same junction for transmitting the operation voltage to the word lines WL<m:0> of the plurality of memory blocks BLK0 to BLKn is configured, so that an area of the switch unit is decreased, thereby improving a degree of integration of the semiconductor device.

Figure 6:
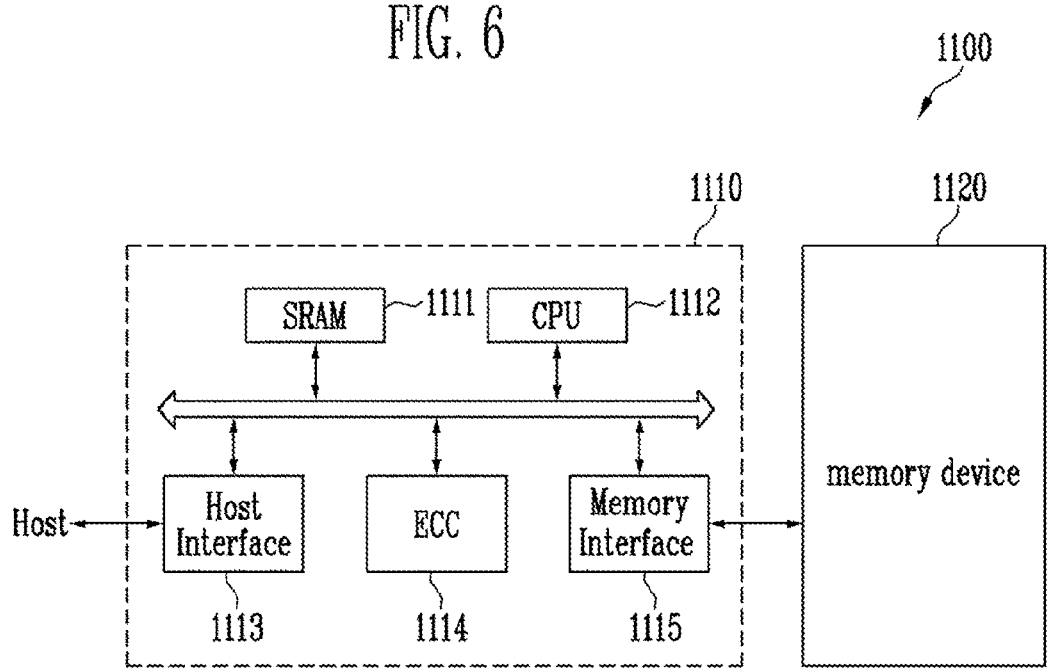
FIG. 6 is a diagram illustrating a memory system according to an embodiment of the present invention.

FIG. 6 is a diagram illustrating a memory system according to an embodiment of the present invention.

Referring to FIG. 6, a memory system 1100 according to an embodiment of the present invention may include a semiconductor memory device 1120 and a memory controller 1110.

The semiconductor memory device 1120 may indicate the semiconductor device described with reference to the embodiments described with reference to FIGS. 1 to 5. Further, the semiconductor memory device 1120 may be a multi-chip package formed of a plurality of flash memory chips.

The memory controller 1110 may be configured to control the semiconductor memory device 1120, and may include an SRAM 1111, a central processing unit (CPU) 1112, a host interface 1113, an error-correction code (ECC) 1114, and a memory interface 1115. The SRAM 1111 may be used as an operational memory of the CPU 1112, the CPU 1112 may perform a general control operation for a data exchange of the memory controller 1110, and the host interface 1113 may include a data exchange protocol of a host connected with the memory system 1100. Further, the ECC 1114 may detect and correct an error included in data read from the semiconductor memory device 1120, and the memory interface 1115 may perform interfacing with the non-volatile memory device 1120. In addition, the memory controller 1110 may further include a read-only memory (ROM) for storing code data for the interfacing with the host, and the like.

As described above, the memory system 1100 including the aforementioned structure may be a memory card or a Solid State Disk (SSD) in which the semiconductor memory device 1120 may be combined with the memory controller 1110. For example, when the memory system 1100 is the SSD, the memory controller 1110 may communicate with an external device (for example, a host) through one of various interface protocols, such as USB, MMC, PCI-E, SATA, PATA, SCSI, ESDI, and IDE.

Figure 7:
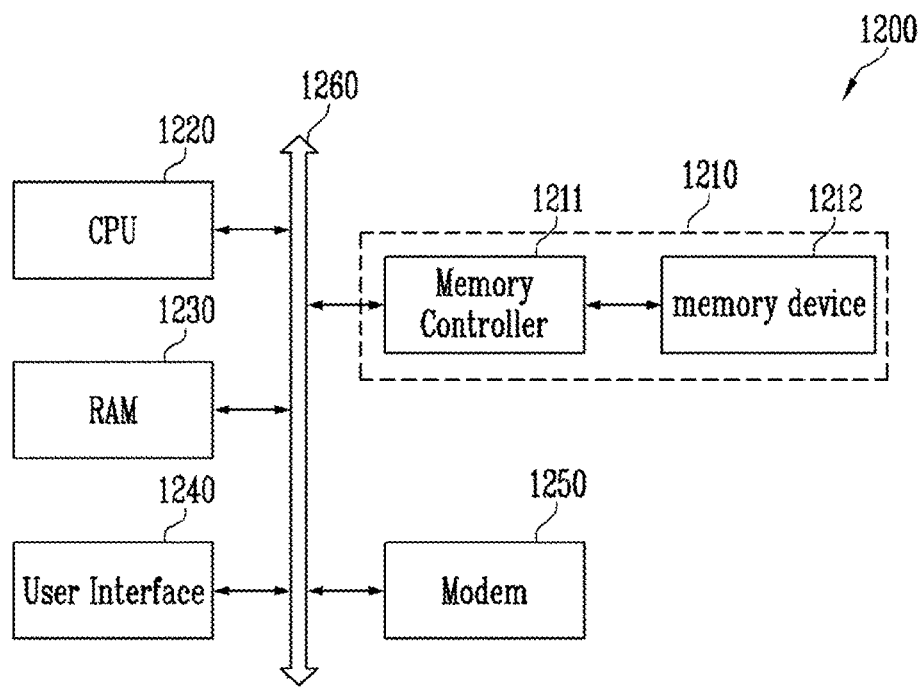
FIG. 7 is a diagram illustrating a computing system according to an embodiment of the present invention.

FIG. 7 is a diagram illustrating a computing system according to an embodiment of the present invention.

Referring to FIG. 7, a computing system 1200 according to an embodiment of the present invention may include a CPU 1220, a RAM 1230, a user interface 1240, a modem 1250, and a memory system 1210, which are electrically connected to a system bus 1260. Further, in a case where the computing system 1200 is a mobile device, the computing system 1200 may further include a battery for supplying an operational voltage to the computing system 1200, and may further include an application chip-set, a Complementary metal-oxide-semiconductor (CMOS) image sensor CIS, a mobile DRAM, and the like. The memory system 1210 may include a memory controller 1211 and a memory device 1212.

The memory system 1210 may include a semiconductor memory device 1120 and a memory controller 1110 as previously described with reference to FIG. 6.

As described above, an embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor device, comprising:
    an active region defined to have five directional extended portions in a semiconductor substrate; and
    gates of first to fifth transistors formed on the five directional extended portions of the active region, respectively,
    wherein the gates of the first to fifth transistors share one junction area of the active region.

2. The semiconductor device of claim 1, wherein the first to fifth transistors are pass transistors for switching one global line and five word lines.

3. The semiconductor device of claim 1, wherein the one junction area is connected with a global word line.

4. The semiconductor device of claim 1, wherein the first to fifth transistors are connected with word lines included in five memory blocks, respectively.

5. The semiconductor device of claim 1, wherein the gates of the first to fifth transistors are disposed to cross the five directional extended portions of the active region, respectively.

6. The semiconductor device of claim 1, further comprising contacts connected with word lines of five memory blocks at ends of the five directional extended portions of the active region.

7. A semiconductor device, comprising: a plurality of memory blocks; and a plurality of switch units for connecting word lines of the plurality of memory blocks and a global word line, wherein each of the plurality of switch units includes five pass transistors, and gates of the five pass transistors are formed on five directional extended portions of an active region, respectively and share one junction area of the active region.

8. The semiconductor device of claim 7, wherein the five pass transistors are pass transistors for switching one global line and at least five word lines.

9. The semiconductor device of claim 7, wherein the one junction area is connected with a global word line.

10. The semiconductor device of claim 7, wherein the five pass transistors are connected with word lines included in at least five memory blocks, respectively.

11. The semiconductor device of claim 7, wherein the gates of the five pass transistors are disposed to cross the five directional extended portions of the active region, respectively.

12. The semiconductor device of claim 7, further comprising contacts connected with word lines of five memory blocks at ends of the five directional extended portions of the active region.

13. A semiconductor memory device, comprising a memory unit including a plurality of memory blocks; a voltage providing unit configured to generate operation voltages; a block selection signal generation unit configured to generate control signals for selecting the plurality of memory blocks; a switch unit configured to transmit the operation voltage to the plurality of memory block in response to the control signals, wherein each of the plurality of switch units includes first to fifth pass transistors, and gates of the first to fifth pass transistor are formed on five directional extended portions of an active region, respectively, and disposed to share one junction area of the active region.

14. The semiconductor device of claim 13, wherein the one junction area is connected with a global word line.

15. The semiconductor device of claim 13, wherein the first to fifth pass transistors are connected with word lines included in five or more memory blocks among the plurality of memory blocks, respectively.

16. The semiconductor device of claim 13, wherein the gates of the first to fifth pass transistors are disposed to cross the five directional extended portions of the active region, respectively.

17. The semiconductor device of claim 13, wherein the first to fifth pass transistors are operated in response to the control signals.

18. The semiconductor device of claim 13, wherein the switch unit selectively connects one global line with five word lines in response to the control signals.

\* \* \* \* \*